(12) United States Patent
Kataoka (10) Patent No.: US 7,013,425 B2
(45) Date of Patent: Mar. 14, 2006

(54) DATA PROCESSING METHOD, AND ENCODER, DECODER AND XML PARSER FOR ENCODING AND DECODING AN XML DOCUMENT

(75) Inventor: Katsuhisa Kataoka, Sagamihara (JP)

(73) Assignee: International Business Machines Corporation, Armonk, NY (US)

(*) Notice: Subject to any disclaimer, the term of this patent is extended or adjusted under 35 U.S.C. 154(b) by 671 days.

(21) Appl. No.: 10/184,692

(22) Filed: Jun. 28, 2002

(65) Prior Publication Data

US 2003/0005001 A1   Jan. 2, 2003

(30) Foreign Application Priority Data

Jun. 28, 2001 (JP) .............................. 2001-195797

(51) Int. Cl.
G06F 17/00    (2006.01)
G06F 17/22    (2006.01)

(52) U.S. Cl. .................................................. 715/513
(58) Field of Classification Search ................ 715/513, 715/514, 500.1, 500
See application file for complete search history.

(56) References Cited

U.S. PATENT DOCUMENTS

| | | | | |
|---|---|---|---|---|
| 5,953,503 | A * | 9/1999 | Mitzenmacher et al. | 703/203 |
| 6,662,342 | B1 * | 12/2003 | Marcy | 715/513 |
| 6,825,781 | B1 * | 11/2004 | Seyrat et al. | 341/50 |
| 6,850,948 | B1 * | 2/2005 | Krasinski | 707/101 |
| 6,883,137 | B1 * | 4/2005 | Girardot et al. | 715/513 |
| 2002/0038320 | A1 * | 3/2002 | Brook | 707/513 |
| 2002/0078241 | A1 * | 6/2002 | Vidal et al. | 709/247 |
| 2002/0120647 | A1 * | 8/2002 | Amano | 707/501.1 |
| 2002/0194219 | A1 * | 12/2002 | Bradley et al. | 707/506 |
| 2003/0033280 | A1 * | 2/2003 | Van Den Hamer et al. | 707/1 |
| 2004/0068696 | A1 * | 4/2004 | Seyrat et al. | 715/513 |

OTHER PUBLICATIONS

Fielding et al., Hypertext Transfer Protocol—HTTP/1.1, RFC 2616, Chapter 14 pps. 1-39 (circa before Jun. 28, 2001 via HotBot.com) ("HTTP/1.1").*
"XMill: an efficient compressor for XML data", Hartmut Liefke & Dan Suciu, May 2000, ACM SIGMOD Record, Proceedings of the 2000 ACM SIGMOD international conference on Management of data SIGMOD '00, vol. 29 Issue 2.*
"Algorithms and programming models for efficient representation of XML for Internet applications", Neel Sundaresan & Reshad Moussa, Apr. 2001, Proceedings of the 10th international conference on World Wide Web.*

* cited by examiner

Primary Examiner—William Bashore
Assistant Examiner—Paul Nguyen-Ba
(74) Attorney, Agent, or Firm—Dillon & Yudell LLP; Gregory M. Doudnikoff (57) ABSTRACT

A technique for converting a compressed XML document to a format usable by an application is provided. The technique is capable of identifying an XML document even in a state that data thereof are compressed and capable of identifying a compression type thereof. When an XML document is originally compressed, an XML header is added to the compressed document, the XML header describing an encoding declaration which indicates that the compressed XML document is provided with encoding inclusive of compression. Thereafter, in an XML parser, a decoder, which converts the XML document into a coding system used by an application, decompresses the XML document based on description of the encoding declaration in the XML header.

4 Claims, 9 Drawing Sheets

```
<?xml version="1.0" encoding="Shift_JIS"?>
<!DOCTYPE GUIDef SYSTEM "Sample.dtd">
<Root>
  <Element attibute="1">Sample Data1</Element>
  <Element attibute="2">Sample Data2</Element>
  <Element attibute="3">Sample Data3</Element>
</Root>
```

(B)

```
<?xml version="1.0" encoding="x-XMLCompress"?>
<!DOCTYPE GUIDef SYSTEM "Sample.dtd">
<Root><Element<1 attibute<2="1">Sample Data1</><<1<2="2">
Sample Data2</><<1<2="3">Sample Data3</></>
```

(C)

```
<?xml version="1.0" encoding="x-XMLCompressWithDTD"?>
<!DOCTYPE GUIDef SYSTEM "Sample.dtd">
<Root><<1 <2="1">Sample Data1</><<1<2="2">Sample Data2</
><<1<2="3">Sample Data3</></>
```

DATA PROCESSING METHOD, AND ENCODER, DECODER AND XML PARSER FOR ENCODING AND DECODING AN XML DOCUMENT

BACKGROUND OF THE INVENTION

1. Field of the Invention

The present invention relates to a technique for encoding and decoding a compressed data file, and more specifically, to a technique capable of identifying the type of compression employed with the data file after compression.

2. Description of the Related Art

The extensible markup language (XML) is a type of markup languages for describing (marking up) a semantic structure of a document with simple marks. XML allows a user to carry out a user-original extension by defining a grammar and imparting logical senses to constituents of the document. Therefore, XML is expected as a data format for use in data exchange on the Internet.

XML involves a concept called a document type definition (DTD), and XML can judge as to whether a document is valid or not valid concerning a certain DTD. Specifically, for example, a grammatical rule is defined such that nodes <TITLE>, <AUTHOR> and <PUBLISHER> appear severally once in this order after a node <BOOK>. Then, it is possible to judge as to whether a certain XML document is valid or not, in other words, whether the XML document accords with the grammatical rule or not.

Incidentally, an XML document expresses a data structure universally by using certain marks (hereinafter referred to as "tags") as described above. Accordingly, the XML document has a characteristic of a larger file size in comparison with other file formats having exclusive data structures.

In this regard, it is possible to reduce a file size of an XML document by compressing the XML document with a universal data compression technology. Since an XML document is basically a text-based flat data file, a high compression effect can be anticipated.

Figure 9:
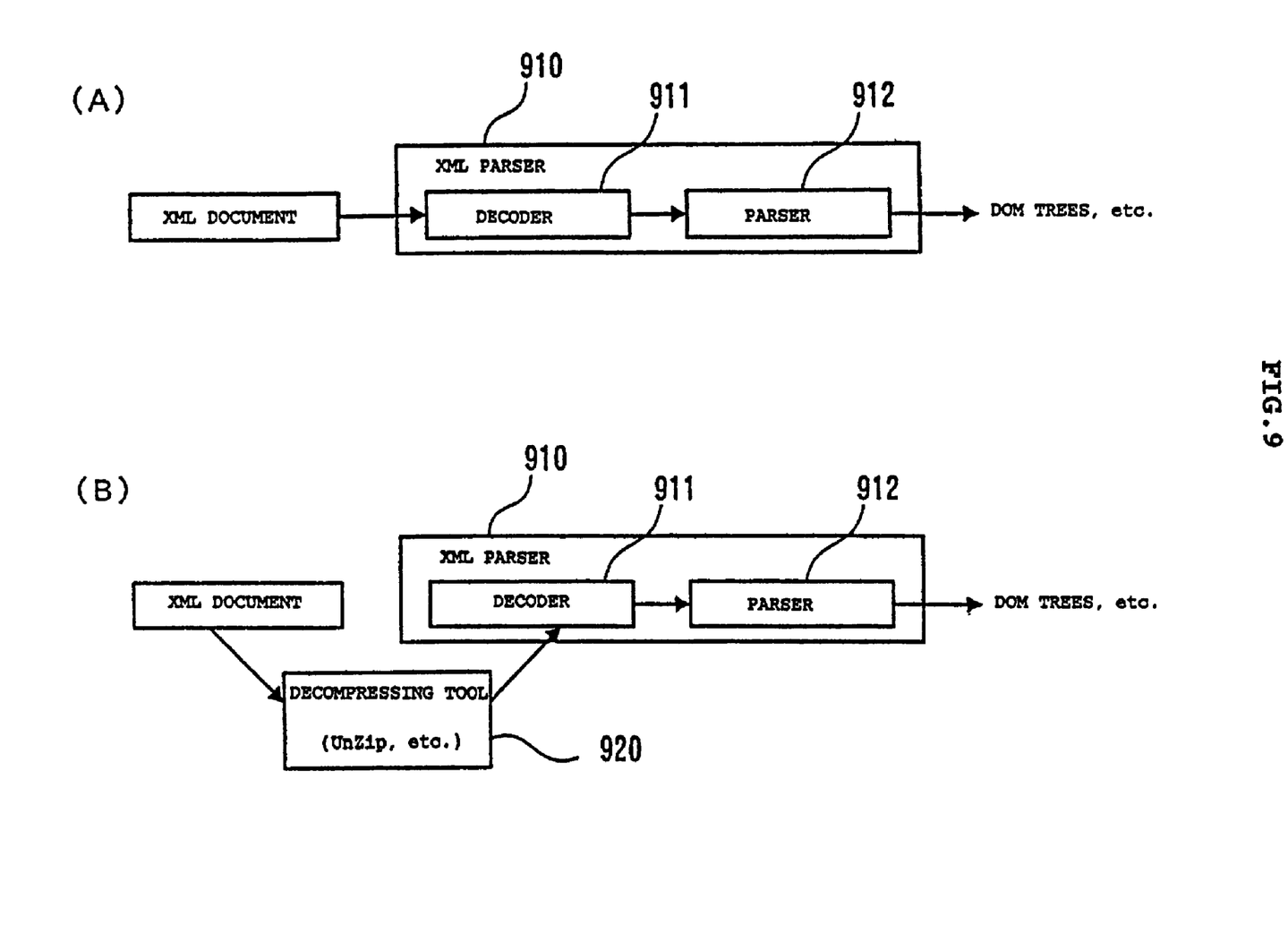
FIGS. 9A and 9B are views for describing conventional procedures of processing an XML document by an XML parser.

FIGS. 9A and 9B are views for describing a conventional procedure for processing an XML document with an XML parser. Here, the XML parser refers to software which converts the XML document into a format usable by an application program, and to a computer which executes the foregoing conversion processing.

FIG. 9A shows a procedure of a case in which the XML original document is input to the XML parser. As shown in the drawing, the XML parser 910 includes a decoder 911 and a parser 912. When the XML document is inputted, the decoder 911 of the XML parser 910 first converts the character code used in the inputted XML document into another character code used by an application (such as UTF-8 or UTF-16 in case of a Java application, for example). Thereafter, the parser 912 analyzes the XML document, converts the XML document into a data format used by the application such as a document object model (DOM) tree, and then outputs the converted XML document.

Meanwhile, FIG. 9B shows a procedure in which the XML document is input to the XML parser after decompressing (expanding) the compressed XML document. In this case, an operation of the XML parser 910 is similar to the case in FIG. 9A. However, the XML document is decompressed by use of a decompressing tool 920 in accordance with the type of compression used to compress the XML document (compression type) prior to inputting the XML document to the XML parser 910.

As described above, an XML document has a characteristic of a larger data size in comparison with other file formats having exclusive data structures. Accordingly, data compression of the XML document is preferred.

In general, when data exchange takes place or when data are stored into a database, a data file is compressed in order to improve transmission efficiency or to downsize the data file to be stored. For this reason, numerous data compression technologies universally applicable to various data formats have been disclosed to date. Accordingly, it is conceivable that any of those conventional data compression technologies may be also applied upon compression of an XML document.

However, when the above-described conventional universal data compression technology is used, a compression process is executed regardless of the data format of the XML document. Accordingly, it is impossible to identify as to whether or not a compressed data file is an XML document in a compressed state.

Moreover, when the compressed XML document is used by an application, two-step procedures are required as described above, namely, a pre-process of decompressing the XML document in accordance with the compression type thereof and a process to input the XML file to the XML parser. Therefore, processing becomes complicated.

In addition, since the decompressing tool (a program) is located ahead of the XML parser, it is not easy to introduce the conventional compression technology to an existing system which analyzes the XML document by the XML parser and utilize the XML document by a certain application.

SUMMARY OF THE INVENTION

Therefore, an object of the present invention is to achieve a conversion method for an XML document capable of identifying an XML document even in a state of data compression, and capable of recognizing a compression type thereof.

Moreover, another object of the present invention is to provide a conversion system for an XML document capable of directly processing the XML document by an XML parser even in a state of data compression, whereby the conversion system can be readily introduced to an existing system.

To attain the foregoing objects, the present invention is deemed as a data processing method for a data file described in a markup language such as the XML which describes a semantic structure of data with marks and describes information on a character code used for description of the data file into a header of the data file, which includes a step of providing given encoding with respect to a part other than the header of the data file after reading the data file which is an object of processing into a processor device, and a step of describing information concerning such encoding in a position within the header where the information on the character code is to be described, in a format common to the information on the character code.

Here, when the data file being the object of processing is an XML document, the step of describing information concerning such encoding into the header of the data file in the data processing method describes the information concerning such encoding as description of an encoding declaration of an XML header.

Furthermore, the step of providing encoding with respect to the data file herein has a constitution to compress the part other than the header of the data file.

The present invention is also deemed as an encoder for encoding an XML document by computer control, which includes compressing means to compress the XML document which is an object of processing, and XML header adding means to add an XML header describing an encoding declaration for indicating that the compressed XML document is provided with encoding inclusive of compression.

In addition to the foregoing constitution, the encoder may further include original header adding means to add information on a character code used in the XML document, which is the object of processing, to the compressed XML document as original header information.

Such an encoder can be provided as a program to control a computer, and to allow the computer to function as the compressing means, the XML header adding means and the original header adding means as described above.

The present invention is also deemed as a decoder for decoding an encoded XML document by computer control, which includes judging means to judge as to whether or not the XML document, which is an object of processing, is an XML document provided with encoding inclusive of compression while reading header information of the XML document, decompressing means to decompress the XML document by a mode relevant to a type of such compression when the XML document of the object of processing is judged as the XML document provided with encoding inclusive of compression, and character code converting means to convert a character code of the decompressed XML document into a character code required by an application which uses the XML document.

Here, the judging means reads an encoding declaration in an XML header describing the header information, obtains information concerning the type of compression of the XML document and transfers the information to the decompressing means.

Moreover, when information on the character code used in the XML document is described in a part other than the XML header of the XML document being the object of processing, the judging means obtains the information concerning the character code and transfers the information to the character code converting means.

Such a decoder can be provided as a program to control a computer, and to allow the computer to function as the judging means, the decompressing means and the character code converting means as described above.

The present invention is also deemed as an XML parser for analyzing an XML document and converting the XML document into a format required by an application which uses the XML document, which includes a decoder portion to convert the XML document, which is an object of processing, into a coding system used by the application, and a parser portion to analyze the XML document code-converted by the decoder portion and to convert the XML document into a data format used by the application. Here, the decoder portion decodes the XML document by a mode relevant to an encoding type thereof when the XML document, which is the object of processing, is an XML document provided with given encoding.

Here, when the XML document being the object of processing is a compressed XML document, the decoder portion decomposes the XML document by a mode relevant to the type of such compression.

To be more precise, the decoder portion reads XML header of the XML document being the object of processing, and recognizes the compression type of the XML document based on description of an encoding declaration in the XML header.

The present invention can also apply the above-described encoding technology for an XML document to a data communication system which uses an XML document upon data exchange. Specifically, such a data communication system includes transmitting and receiving data processing devices. The transmitting data processing device includes an encoder which provides an XML document, which is an object of transmitting, with encoding inclusive of compression and adds an XML header describing an encoding declaration for indicating that the XML document is provided with encoding inclusive of compression, and a transmitting portion which transmits the XML document encoded by the encoder. Meanwhile, the receiving data processing device includes a receiving portion which receives the XML document transmitted from the transmitting data processing device, and an XML parser which decompresses the XML document by a mode relevant to a compression type applied to the XML document based on description of the XML header of the XML document received by the receiving portion, then analyzes the decompressed XML document and converts the XML document into a data format used by an application.

Furthermore, the present invention can be realized as a program to control a computer. Specifically, a program according to the present invention allows a computer to execute a process to compress an XML document which is an object of processing, and a process to add an XML header describing an encoding declaration for indicating that the compressed XML document is provided with encoding inclusive of compression.

Moreover, the present invention can be also realized as a program which allows a computer to execute a process to read an XML header of an XML document, which is an object of processing, and to judge as to whether or not the XML document of the object of processing is an XML document provided with encoding inclusive of compression, a process to decompress the XML document by a mode relevant to a compression type applied to the XML document based on description of the XML header of the XML document when the XML document of the object of processing is judged as the XML document provided with encoding inclusive of compression, and a process to convert a character code of the decompressed XML document into a character code required by an application which uses the XML document.

BRIEF DESCRIPTION OF THE DRAWINGS

For a more complete understanding of the present invention and the advantages thereof, reference is now made to the following description taken in conjunction with the accompanying drawings, in which.

DESCRIPTION OF THE PREFERRED EMBODIMENT

Now, the present invention will be described in detail based on the preferred embodiments as shown in the accompanying drawings.

First, a description will be made regarding an outline of the present invention.

Normally, an XML header (an XML declaration) is added to the front of an XML document. For further details, please refer to Appendix F of W3C Recommendation XML 1.0. The XML header is a character string which clearly indicates relevant data that constitute an XML document. The XML header can perform a declaration for the version of the XML, an encoding declaration (a declaration for a character code) and a declaration as to whether or not the XML document is a stand-alone document. An XML parser can identify the character code used in the XML document with reference to the encoding declaration in the XML header.

Upon compression of the XML document, the present invention leaves the XML header intact and compresses other parts (XML instances and DTDs). In this way, it is possible to identify that a compressed data file is an XML document by referring to an XML header, which is a header of the relevant data file.

Moreover, upon compression of an XML file in accordance with the above-described mode of the present invention, the encoding declaration, that is, the declaration for specifying the character code, is used extensibly to declare a compression type (an encoding method) of the XML document. In this way, it is possible to refer to the XML header after data compression, whereby identification of the compression type becomes feasible.

Figure 1:
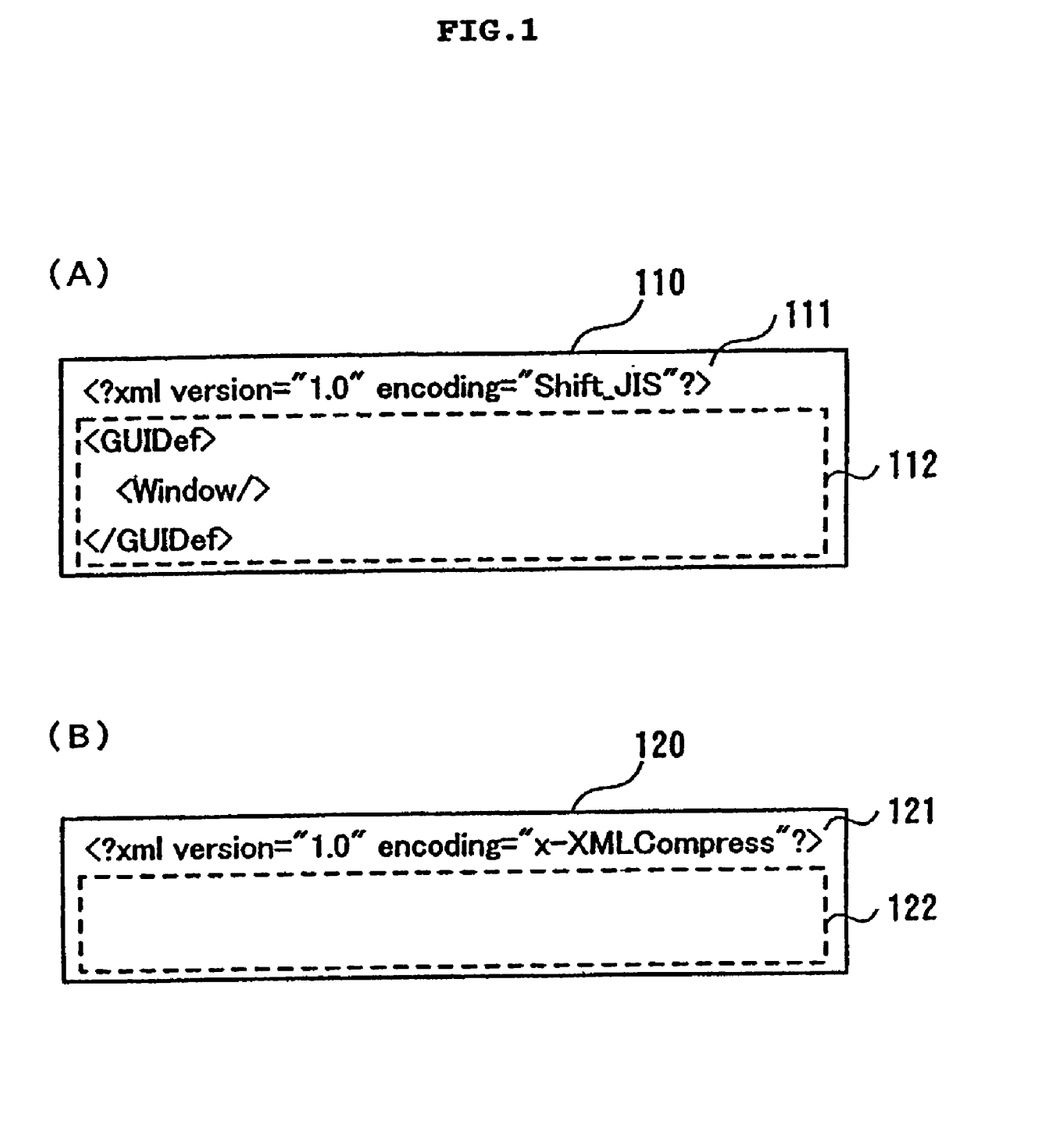
FIGS. 1A and 1B are views for describing a method of data compression according to an embodiment of the present invention.

FIGS. 1A and 1B are views for describing a data compression method according to the embodiment. FIG. 1A is a view showing a standard uncompressed XML document, and FIG. 1B is a view showing a state of compression by the embodiment.

As shown in FIG. 1A, an XML document 110 used in the embodiment includes an XML header 111 and a data portion 112 containing other parts (although other parts beside the XML header 111 therein may include DTDs and XML instances, those parts will be collectively referred to as the data portion 112 in the embodiment, for the embodiment is characterized in description of the XML header 111).

In the XML header 111, a declaration for an XML version and an encoding declaration are described, and Shift-JIS is specified as a character code therein. Therefore, the data portion 112 are described in text readable with Shift-JIS.

As shown in FIG. 1B, a compressed XML document 120 includes an XML header 121 and a data portion 122 containing other parts.

In the XML header 121, a declaration for an XML version and an encoding declaration are described. As to the declaration for an encoding type, "x-XMLCompress" is described to indicate that data in the XML document 120 are compressed. Specifically, the present invention extends the encoding declaration, which has been conventionally used for the declaration of the character code of the XML document 120, to a declaration of a compression type, whereby compression, decompression and identification of an XML document are effectuated with a relatively simple modification. Therefore, the data portion 122 at this stage are compressed binary data. Although the data portion 122 is smaller in size than the data portion 112, the data portion 122 is not readable as it is.

In other words, the present invention performs encoding inclusive of compression with respect to data in the XML document 120 in a similar manner to usual character encoding. Therefore, terms such as "encoding" or "conversion", which will be hereinafter stated as appropriate, will include not only the usual character encoding but also compression processing of the data portion 122.

Figure 2:
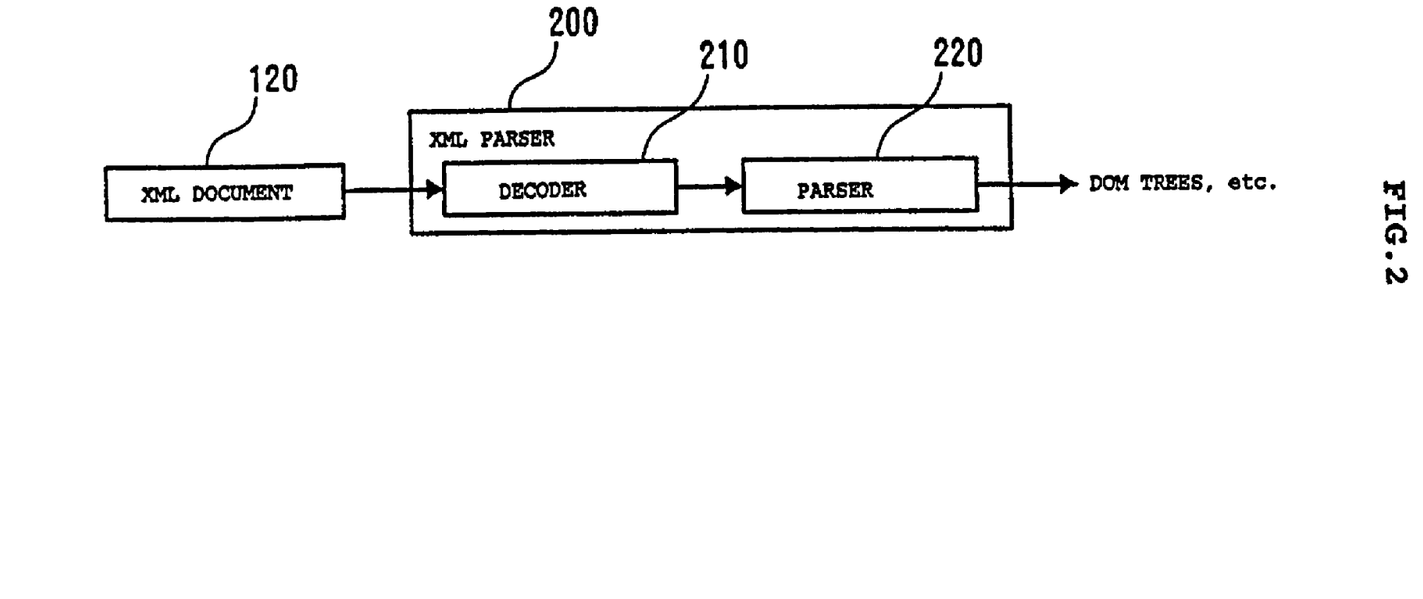
FIG. 2 is a view for describing procedures in the event of processing an XML document converted into a format as shown in FIG. 1B with an XML parser, by use of the embodiment.

FIG. 2 is a view for describing procedures for processing the XML document 120, which is converted into the format as illustrated in FIG. 1B by use of the embodiment, by an XML parser.

As shown in FIG. 2, an XML parser 200 includes a decoder 210 and a parser 220. In the XML parser 200, when the XML document 120 converted into the format illustrated in FIG. 1B is inputted, the decoder 210 first converts the inputted XML document 120 into a coding system used by an application. Then, the parser 220 analyzes the XML document 120, converts the XML document 120 into a data format such as a DOM tree used by the application, and then outputs the XML document 120.

The decoder 210 first refers to the XML header 121 to identify the compression type of the data portion 122, and then decompresses the data portion 122. Then, usual conversion of the character code takes place with respect to the decompressed data portion 122 (which is identical at that point to the data portion 112 of the XML document 110 in FIG. 1A).

Here, the encoding declaration of the XML header 121 in FIG. 1B is stated as:

encoding="x-XMLCompress"?

Whereas it is understood that the XML document 120 is compressed by referring to the foregoing, it is impossible to determine the type of character encoding. Specifically, information on character encoding originally possessed by the XML document will be lost by performing encoding inclusive of compression.

In this context, a possible remedy is to specify the character code for use in advance depending on the application which uses the XML document 120. For example, when the XML document 120 is premised on running on a Java application, the character code of the XML document 120 may be settled on UTF-8, which is easy to handle. In this way, the decoder 210 can perform conversion of the character code appropriately without information on character encoding in the XML header 121.

Meanwhile, if specified character coding needs to be saved (such as in a case for avoiding influences by code conversion), then a possible remedy in this event is to add original header information for describing the type of character encoding to the data portion 122. In this way, the decoder 210 can recognize the compression type of the data portion 122 by referring to the XML header 121 and the type of character encoding by referring to the header information of the data portion 122.

After the data portion 122 is decompressed and the character code thereof is appropriately converted by the decoder 210 as described above, the parser 220 analyzes the XML document 120, converts the XML document 120 into a data format such as the DOM tree used by the application, and then outputs the XML document 120. The foregoing process by the parser 220 is similar to a process by a conventional XML parser.

Next, description will be made further in detail regarding an encoder for generating the XML document 120 in the format as shown in FIG. 1B and a decoder for reading the XML document 120, those which realize the embodiment.

Figure 3:
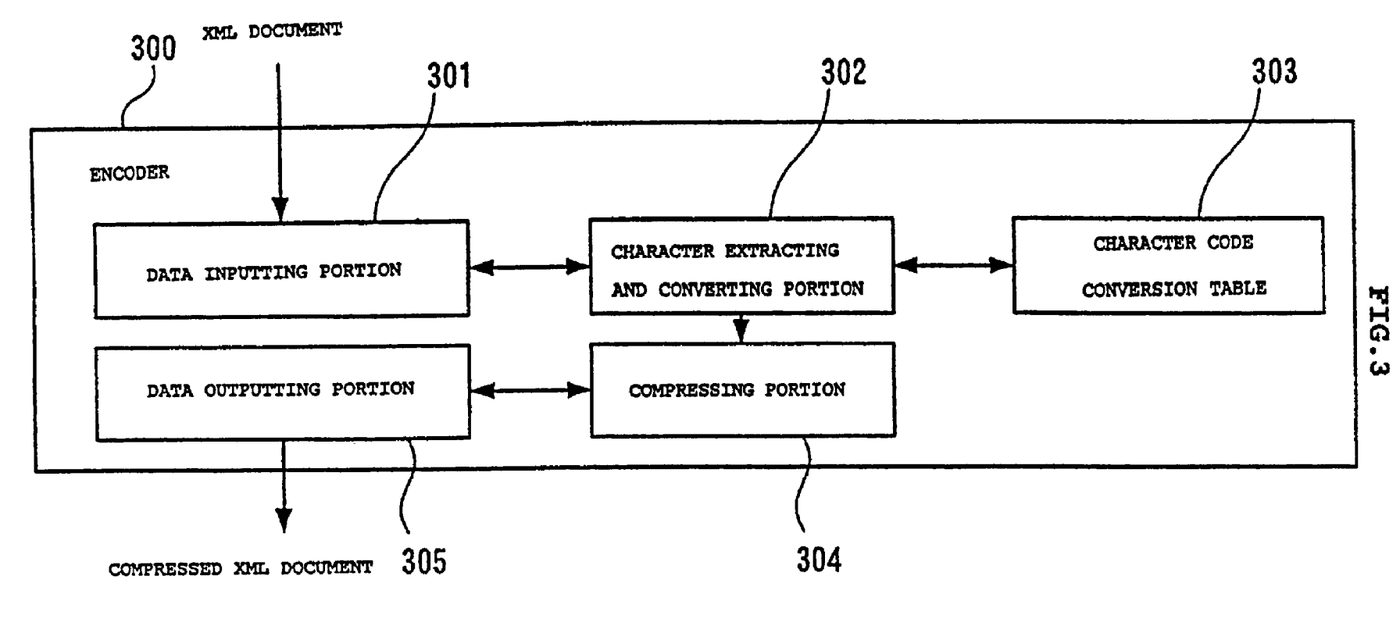
FIG. 3 is a view for showing a constitution of an encoder used in the embodiment.

FIG. 3 is a view showing a constitution of an encoder. As shown in FIG. 3, an encoder 300 includes a data inputting portion 301 for inputting an XML document which is an object of encoding, a character extracting and converting portion 302 and a character code conversion table 303 for adjusting character encoding of the inputted XML document, a compressing portion 304 for performing data compression, and a data outputting portion 305 for outputting the compressed XML document 120.

The character extracting and converting portion 302 extracts characters out of the inputted XML document, and then performs character conversion of the extracted characters with reference to the character code conversion table 303. For example, assuming that the type of character encoding for the XML document 120 is settled on UTF-8 as described above, if the inputted XML document is created by a Java application, then the inputted document uses Unicode. Therefore, the character extracting and converting portion 302 performs conversion from Unicode to UTF-8.

The compressing portion 304 compresses the XML document after conversion of the character code thereof by the character extracting and converting portion 302, thus generating the data portion 122 of the XML document 120. Although various universal compression technologies including ZIP can be used as a compression logic to perform such compression, it is also possible to apply an exclusive compression logic which utilizes structural characteristics of XML documents as described later.

Moreover, the compressing portion 304 generates the XML header describing information indicating the compression type as the encoding declaration based on the compression logic used in compression of the data portion 122, and add the XML header 121 to the data portion 122. Furthermore, in order to save character encoding used in the XML document prior to compression, the compressing portion 304 can generate an original header describing information on such character encoding and add the original header to the data portion 122.

In the embodiment, these character extracting and converting portion 302 and the compressing portion 304 perform the above-described two processes. However, since each of these processes is an encoding process with respect to the XML document, these processes are treated as essentially the same as adjusting steps of character encoding by a conventional encoder. In other words, the steps of encoding the XML document themselves are similar to the prior art. However, whereas the prior art only performs conversion of the character code, the embodiment performs conversion including compression.

Figure 4:
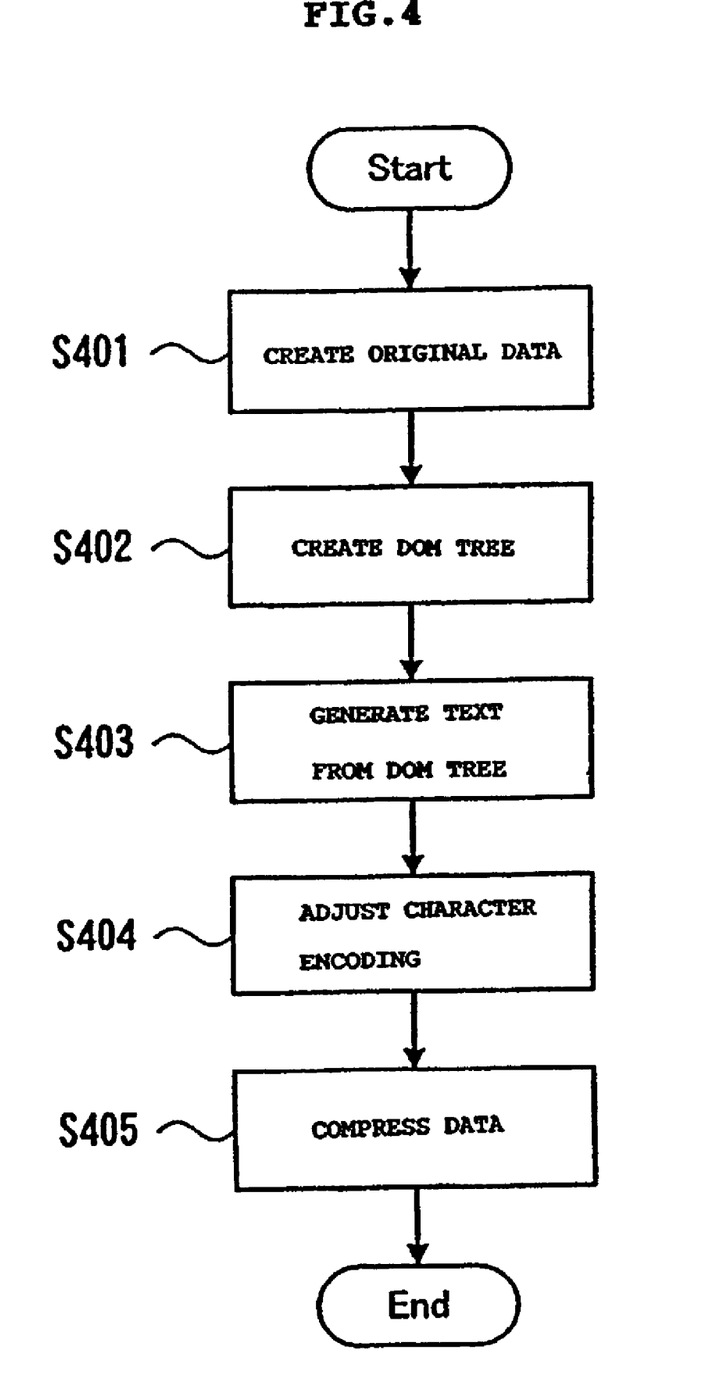
FIG. 4 is a flowchart for describing a process to generate an XML document according to the embodiment.

FIG. 4 is a flowchart for describing a process of generating the XML document 120 including the encoding process by the encoder 300 shown in FIG. 3.

As shown in FIG. 4, original data for creating the XML document 120 is created to begin with (Step 401), and then a DOM tree which is an XML document structure is created (Step 402). Thereafter, text corresponding to the data portion 122 of the XML document 120 is generated based on the created DOM tree (Step 403).

Next, the text generated in Step 403 is inputted to the encoder 300, and the character extracting and converting portion 302 performs adjustment of character encoding of the text (Step 404). Thereafter, the compressing portion 304 compresses the text and the XML header is added thereto, whereby the XML document 120 is created (Step 405).

In the above-described process, operations from Step 401 to Step 403 refer to the case of creating the XML document 120 mechanically by a Java application or the like. When the XML document is created by editor software or the like, the XML document 110 in the usual format as shown FIG. 1A is created in the first place and the XML document 110 is inputted to the encoder 300. Accordingly, the encoder 300 initiates the process with Step 404.

Moreover, when the XML document is created by editor software or the like, it is possible to create the XML document from the beginning while using the character code supposed by the decoder. Specifically, if the type of character encoding for the XML document 120 is previously settled on UTF-8 as described above, then it is possible to create the XML document 120 with the character code of UTF-8 from the beginning. In this case, the adjustment of character encoding in Step 404 becomes unnecessary. Therefore, the encoder 300 only executes encoding for the compression process in Step 405.

Figure 5:
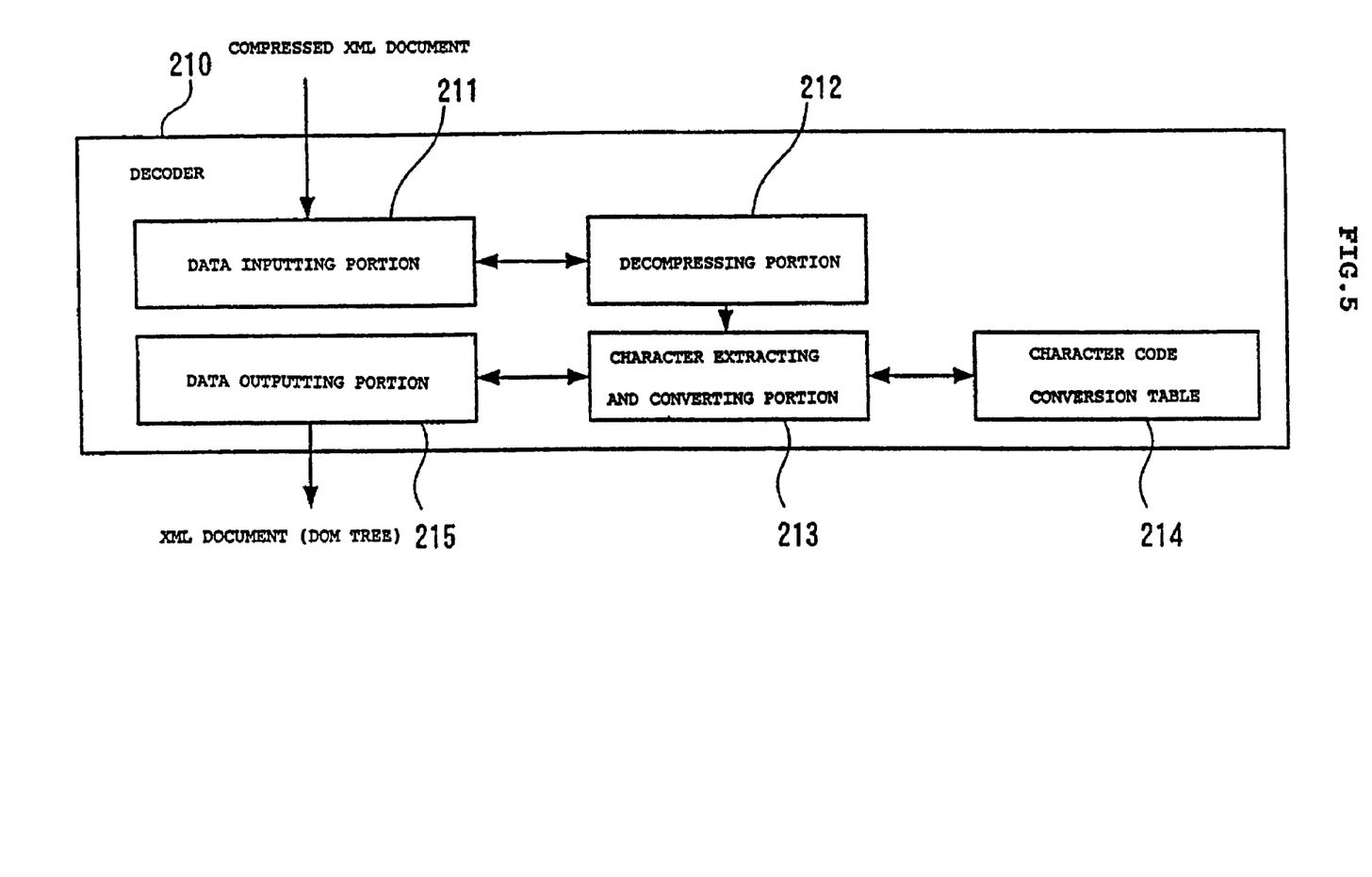
FIG. 5 is a view for showing a constitution of a decoder reading the XML document according to the embodiment.

FIG. 5 is a view showing a constitution of the decoder 210 to read in the XML document 120 created in accordance with the foregoing process.

As shown in FIG. 5, the decoder 210 includes a data inputting portion 211 for inputting the XML document 120, a decompressing portion 212 for decompressing (expanding) the inputted XML document 120, a character extracting and converting portion 213 and a character code conversion table 214 for adjusting character encoding of the XML document 120, and a data outputting portion 215 for outputting text obtained by the foregoing conversion and for transferring the text to the parser 220.

The decompressing portion 212 decomposes and converts the XML document 120 into an XML document readable by a certain character code. The decompressing portion 212 includes an appropriate decompression logic for decompressing the XML document 120. Here if the compression type of the XML document 120 is settled on one type, then the decompressing portion 212 should prepare only one decompression logic. However, if several compression types are possibly applied, then the decompressing portion 212 needs to prepare multiple types of decompression logic in response thereto.

The character extracting and converting portion 213 extracts characters out of the XML document decompressed by the decompressing portion 212, and then performs code conversion of the extracted characters with reference to the character code conversion table 214. Here, if character encoding of the XML document 120 is settled on UTF-8 as described above, and if the XML document created by the XML parser 200 is used by a Java application, then the character extracting and converting portion 213 performs conversion from UTF-8 to Unicode. Moreover, if the header information specifying the type of character encoding is added to the data portion 122 of the compressed XML document 120, then the character extracting and converting portion 213 can select the required character code conversion table 214 based on the header information.

Figure 6:
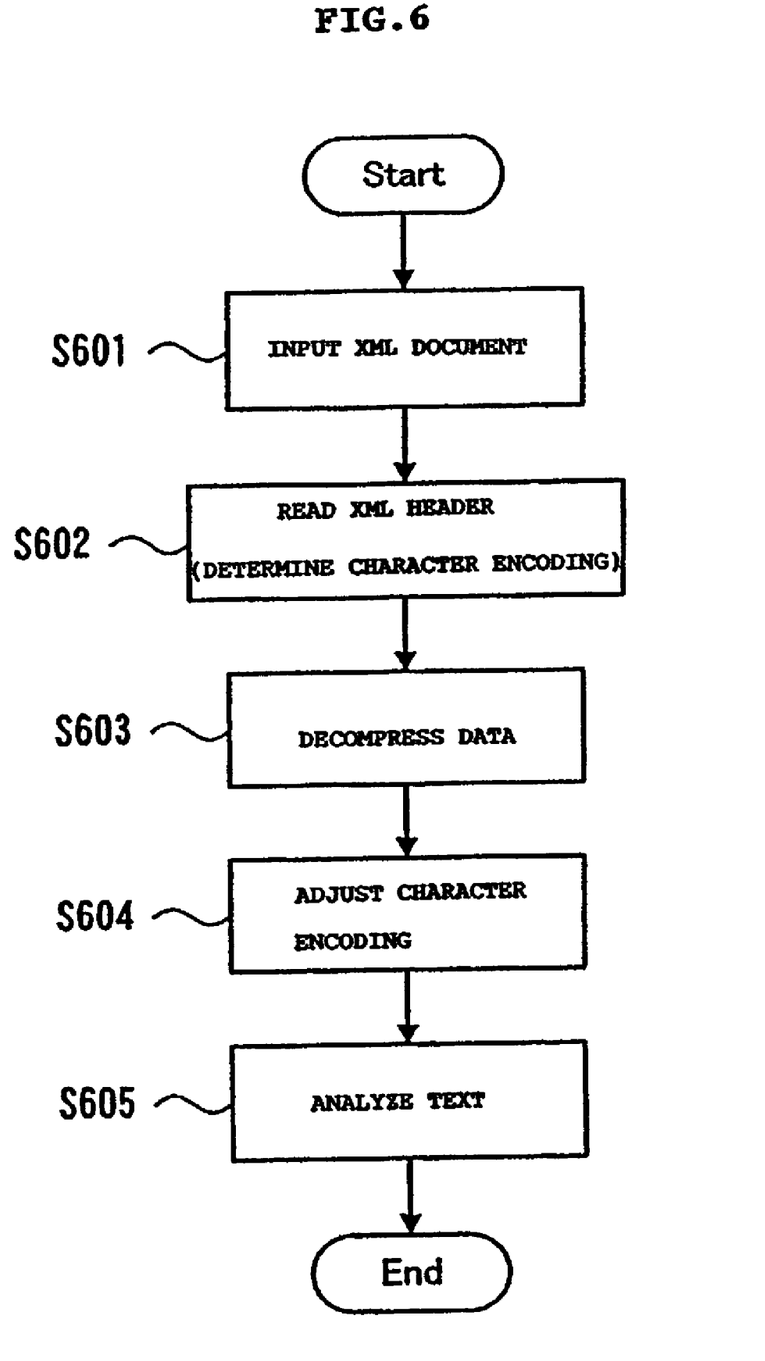
FIG. 6 is a flowchart for describing a process to read the XML document according to the embodiment.

FIG. 6 is a flowchart for describing a process of reading the XML document 120 including a process by the decoder 210 shown in FIG. 5.

As shown in FIG. 6, the XML document 120 is first inputted to the decoder 210 of the XML parser 200 (Step 601), and then the data inputting portion 211 reads contents of the XML header 121 (Step 602). In this way, encoding information (that is, information as to whether or not the XML document 120 is encoded including compression) of the XML document 120 is identified. Moreover, if the header information describing the type of character encoding is present in the data portion 122, the data inputting portion 211 also reads such information. In this way, character encoding of the XML document 120 is determined.

Next, these pieces of information are transferred to the decoder 210 and an appropriate decompression logic is selected by the decompressing portion 212 based on the information of the XML header 121 obtained in Step 602, whereby the data portion 122 of the XML document 120 is decompressed (Step 603). Thereafter, the character extracting and converting portion 213 performs adjustment of character encoding of the decompressed XML document (Step 604). If the information for specifying the type of character encoding is not contained in the information obtained in Step 602, then the character extracting and converting portion 213 selects the appropriate character code conversion table 214 and performs conversion based on the character code settled in advance. If the information for specifying the type of character encoding is contained in the information obtained in Step 602, then the character extracting and converting portion 213 selects the appropriate character code conversion table 214 and performs conversion based on the relevant information.

After the foregoing steps, the reading process moves to a process by the parser 220, in which a text analysis takes place and the XML document is converted into a data format such as the DOM tree used by an application (Step 605).

As described above, in the embodiment, a conventional universal compression method can be used for compression of the data portion 122 of the XML document 120. Alternatively, a compression mode based on the structure of the XML can be also used therefor. Since an XML document possesses redundancy in tag description for indicating a semantic structure of a document and the like, a high compression rate is expected if an exclusive compression mode utilizing the structure of the XML is applied.

Next, description will be made regarding an example of such an exclusive compression mode utilizing the structure of the XML. A well-formed XML document possesses the following characteristics:

1) deletion of white spaces between tags (except in a text data section) does not affect data;
2) white spaces as attribute delimiters within tags can be minimized;
3) deletion in a comment portion is also possible in some cases;
4) names which are defined in a DTD are repeatedly used as tag names and attribute names;
5) a character "<" is used as a special character; and
6) a start tag and an end tag always correspond to each other, therefore a character string of the end tag can be omitted.

Accordingly, a compression mode using the foregoing characteristics is conceivable. Since (1), (2) and (3) seems obvious, description will be made regarding a concrete compression mode concerning (4), (5) and (6). It should be noted that a mode processible by one pass is preferred as the compression mode herein, because XML data are frequently processed as streams.

Upon processing tags and attributes, in the case of a character string that appears for the first time, a relevant entry is added to a table inside an encoder and a unique ID is allocated thereto, then the unique ID is marked up after "<" (such as "<1" and "<2"). According to the rules of the XML, it is guaranteed that "<" does not appear in that place. In the case that the character string is not the one which appears for the first time, then the character is not outputted by only the ID following "<" is marked up. A route tag is not subject to such a process, because the route tag appears only once. A simple example of a result of the foregoing process is shown in FIGS. 7A to 7C.

Figure 7:
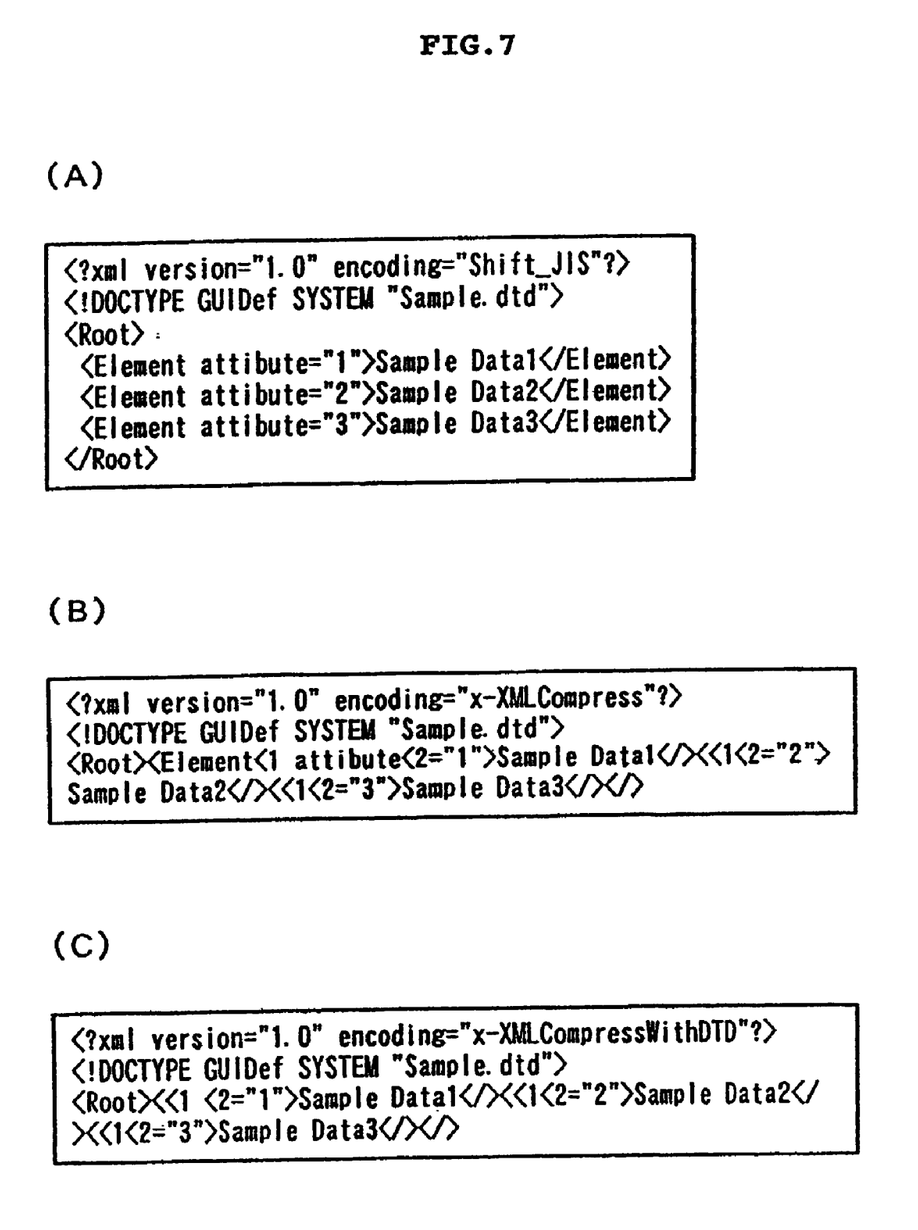
FIGS. 7A to 7C are views for describing an example of compression of an XML document according to the embodiment.

FIG. 7A shows source data of an original XML document which is an object of compression. FIG. 7B shows an interim code. Although such a state does not constitute effective XML data, the interim code is a part of a pre-process for compression. The interim code retains sufficient data for allowing the decoder 210 to restore such data to the one equivalent (as XML data) to the XML document shown in FIG. 7A.

If a DTD is completely decided in advance and there is no chance for modification thereof, then it is possible to extract character strings out of the DTD as candidates for tag names and attribute names, and to create a table for each DTD by allocating unique IDs severally to the character strings. When the foregoing method is applicable, since an XML instance which uses the common DTD does not have to possess a character string table individually, it is possible to obtain a higher compression rate.

FIG. 7C shows an example of providing more advanced modification with respect to the data in the state shown in FIG. 7B in the foregoing case.

Eventually, a higher compression rate can be obtained by compressing the data while using an appropriate compressing tool (for example, java.util.zip.GZIPOutputStream in case of Java) after providing the foregoing process.

Figure 8:
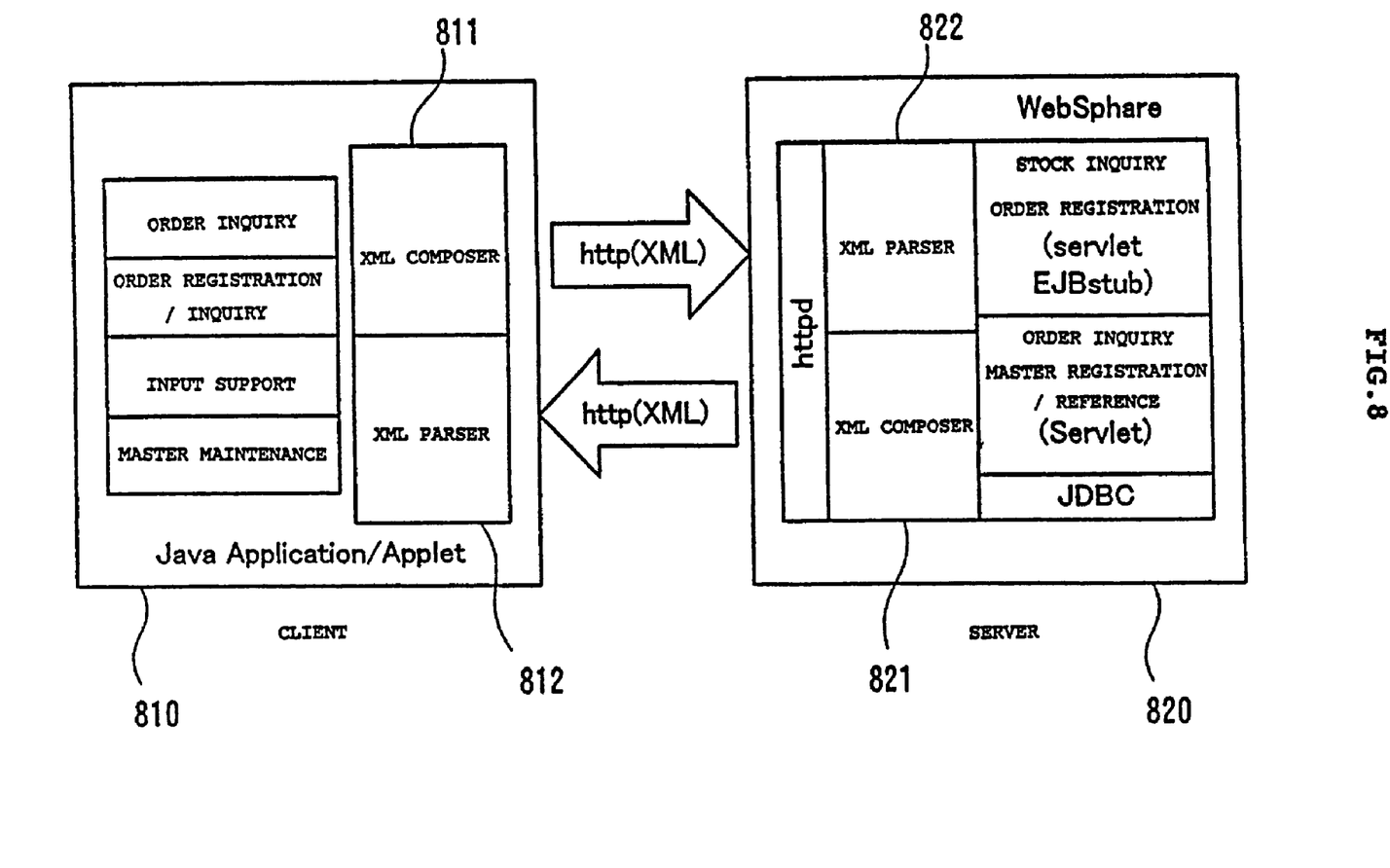
FIG. 8 is a view showing an example to apply the present invention upon exchanging an XML document between a client and a server.

FIG. 8 shows an example of applying the embodiment to a situation to exchange XML documents between a client and a server.

A client-server system shown in FIG. 8 is a system for ordering merchandise or the like via a network, in which an XML document is used for communication on the network. In other words, a request and a response are created in XML documents upon processes of placement of an order by a client 810, receipt of the order by a server 820, and the like, and the XML documents are transmitted and received between the client 810 and the server 820.

The client 810 includes an XML composer 811 and an XML parser 812. The server 820 includes an XML composer 821 and an XML parser 822. Moreover, a request to be sent by the client 810 is transmitted from the XML composer 811 as an XML document. After received by the server 820, the XML document is analyzed and processed by the XML parser 822. Similarly, a response to be sent by the server 820 is transmitted from the XML composer 821 as an XML document. After received by the client 810, the XML document is analyzed and processed by the XML parser 812.

In this event, the XML composers 811 and 821 encode the XML documents as described with reference to FIG. 3 and FIG. 4. Meanwhile, the XML parsers 812 and 822 decode the XML documents as described with reference to FIG. 5 and FIG. 6.

As described above, the embodiment loads a function to compress an XML document as one type of encoding with respect to the XML document. In this way, it is possible to introduce a mode of data compression according to the embodiment only by adding a decoder relevant to such encoding inclusive of compression, while not affecting an existing XML parser.

Since a data size of the XML document encoded (that is, compressed) according to the embodiment is reduced, the XML document is also usable in a database system for reducing a data quantity to be stored in a storage device, in addition to the use in data communication as shown in FIG. 8. In this case, when the XML document is stored as data treated by the database, the XML document is provided with encoding inclusive of compression and then stored in the storage device. When the data are read out, an XML parser provided with the decoder according to the embodiment analyzes the data.

Moreover, description has been made in the embodiment regarding the case of compressing an XML document as encoding. However, it is also possible to load a variety of processing such as enciphering of an XML document similarly as one type of encoding with respect to the XML document.

In the case of encoding inclusive of enciphering, a data portion (a portion other than an XML header) of an XML document is enciphered similarly to the above-described case of compression, and an encoding declaration indicating that the data portion is enciphered is described in the XML header. Then, the enciphering process can be achieved by providing an XML parser with a decoder having logic to decipher the data portion of the enciphered XML document. Since enciphering is loaded as one type of encoding, such a function can be easily introduced to an existing system which uses an XML parser, as similar to the embodiment described regarding compression.

Furthermore, description has been made in the embodiment regarding the case of providing a compression process as encoding an XML document. However, without limitations to the XML documents, encoding such as compression according to the embodiment can be performed with respect to a document written in a markup language which describes a semantic structure of data with marks and which describes information, such as a character code used for description of a data file thereof, into a header of the data file, so far as the markup language includes a specification to allow some alteration of description of the header.

As described above, the present invention can identify a document as an XML document and identify a compression type thereof by reading a header, even in a state that data of the document are compressed.

In addition, since the data-compressed document can be directly treated by an XML parser, the present invention can be easily introduced to an existing system which uses XML documents.

Although the preferred embodiment of the present invention has been described in detail, it should be understood that various changes, substitutions and alternations can be made therein without departing from spirit and scope of the inventions as defined by the appended claims.

What is claimed is:

1. In a computing environment, a decoder for decoding an encoded XML document by computer control, said decoder comprising:
   means for determining whether an XML document being processed contains encoding inclusive of compression based on header information in the XML document;
   means for decompressing the XML document by a mode relevant to a type of the compression if it is determined by said determining means that the XML document is provided with encoding inclusive of compression; and
   character code converting means for converting a character code of the decompressed XML document into a character code required by an application which uses the XML document,
   wherein said means for determining:
      reads an encoding declaration in the header information,
      obtains information concerning the type of compression of the XML document,
      transfers the information to said decompressing means,
      obtains information concerning a character code, and
      transfers the information to the character code converting means if the information about said character code used in the XML document is found in information of the XML document other than the header information.

2. A computer-implemented method for decoding an encoded XML document, said computer-implemented method comprising:
   determining whether an XML document being processed contains encoding inclusive of compression based on header information in the XML document;
   decompressing, through the use of a decompressing means, the XML document by a mode relevant to a type of the compression if it is determined by said determining means that the XML document is provided with encoding inclusive of compression; and
   converting, through a use of a character code converting means, a character code of the decompressed XML document into a character code required by an application which uses the XML document,
   wherein said determining step includes:
      reading an encoding declaration in the header information,
      obtaining information concerning the type of compression of the XML document,
      transferring the information to said decompressing means,
      obtaining information concerning a character code; and
      transferring the information to the character code converting means if the information about said character code used in the XML document is found in information of the XML document other than the header information.

3. A data communications system comprising:
   means for determining whether an XML document being processed contains encoding inclusive of compression based on header information in the XML document;
   means for decompressing the XML document by a mode relevant to a type of the compression if it is determined by said determining means that the XML document is provided with encoding inclusive of compression; and
   means for converting a character code of the decompressed XML document into a character code required by an application which uses the XML document,
   wherein said means for determining includes:
      means for reading an encoding declaration in the header information,
      means for obtaining information concerning the type of compression of the XML document,
      means for transferring the information to said means for decompressing,
      means for obtaining information concerning a character code, and means for transferring the information to the means for converting character code converting if the information about said character code used in the XML document is found in information of the XML document other than the header information.

4. A computer-usable medium embodying computer program code, the computer program code comprising computer executable instructions configured to:
determine whether an XML document being processed contains encoding inclusive of compression based on header information in the XML document;
decompress, through the use of a decompressing means, the XML document by a mode relevant to a type of the compression if it is determined that the XML document is provided with encoding inclusive of compression; and
convert, through the use of a character code converting means, a character code of the decompressed XML document into a character code required by an application which uses the XML document,
wherein said instructions configured to determine whether an XML document being processed contains encoding inclusive of compression based on header information in the XML document are configured to:
read an encoding declaration in the header information,
obtain information concerning the type of compression of the XML document,
transfer the information to the decompressing means,
obtain information concerning a character code, and
transfer the information to the character code converting means if the information about said character code used in the XML document is found in information of the XML document other than the header information.

* * * * *